(12) United States Patent
Limpin et al.

(10) Patent No.: US 8,717,061 B2
(45) Date of Patent: May 6, 2014

(54) ALL-IN-ONE MOTOR ASSESSMENT PRECISION SIZING SYSTEM AND CAPACITANCE CALCULATOR UNIT

(75) Inventors: Ricardo C. Limpin, Paranaque (PH); Lilibeth S. Mediavillo, Denton, TX (US); Angel Vicente G. Arcilla, Denton, TX (US)

(73) Assignee: Repesa, LLC, New York, NY (US)

( * ) Notice: Subject to any disclaimer, the term of this patent is extended or adjusted under 35 U.S.C. 154(b) by 536 days.

(21) Appl. No.: 13/100,333

(22) Filed: May 4, 2011

(65) Prior Publication Data
US 2012/0210806 A1      Aug. 23, 2012

(30) Foreign Application Priority Data
Feb. 18, 2011 (PH) ............................... 1-2011-00052

(51) Int. Cl.
*G01R 31/34* (2006.01)
(52) U.S. Cl.
USPC ................................................ 324/765.01

(58) Field of Classification Search
CPC ..... G01R 31/343; G01R 1/00; G01R 2019/00; G01R 31/00; G01R 27/26; G01R 29/24
See application file for complete search history.

(56) References Cited

U.S. PATENT DOCUMENTS

| | | | | |
|---|---|---|---|---|
| 5,862,247 A | * | 1/1999 | Fisun et al. | 382/116 |
| 6,989,664 B2 | * | 1/2006 | Shim et al. | 324/96 |

* cited by examiner

*Primary Examiner* — Tung X Nguyen
(74) *Attorney, Agent, or Firm* — Shlesinger, Arkwright & Garvey LLP

(57) ABSTRACT

An apparatus designed to accurately measure the capacitance required in order to optimize the power factor of single phase and three phase induction motors. Capacitor circuits are interruptably connected to the busses by means of push-button switches. Leads electrically connected to the busses are attached to a calculator unit which is, in turn, electrically connected to the load leads. The calculator unit displays in digital figures the actual operating conditions of an induction motor and the capacitance required for power factor optimization. The correct capacitance required to increase power factor in the 99% to 100% range is determined by either: (1) pushing a switch or a combination of switches, or (2) pushing the automatic mapping switch.

1 Claim, 3 Drawing Sheets

Figure 1:
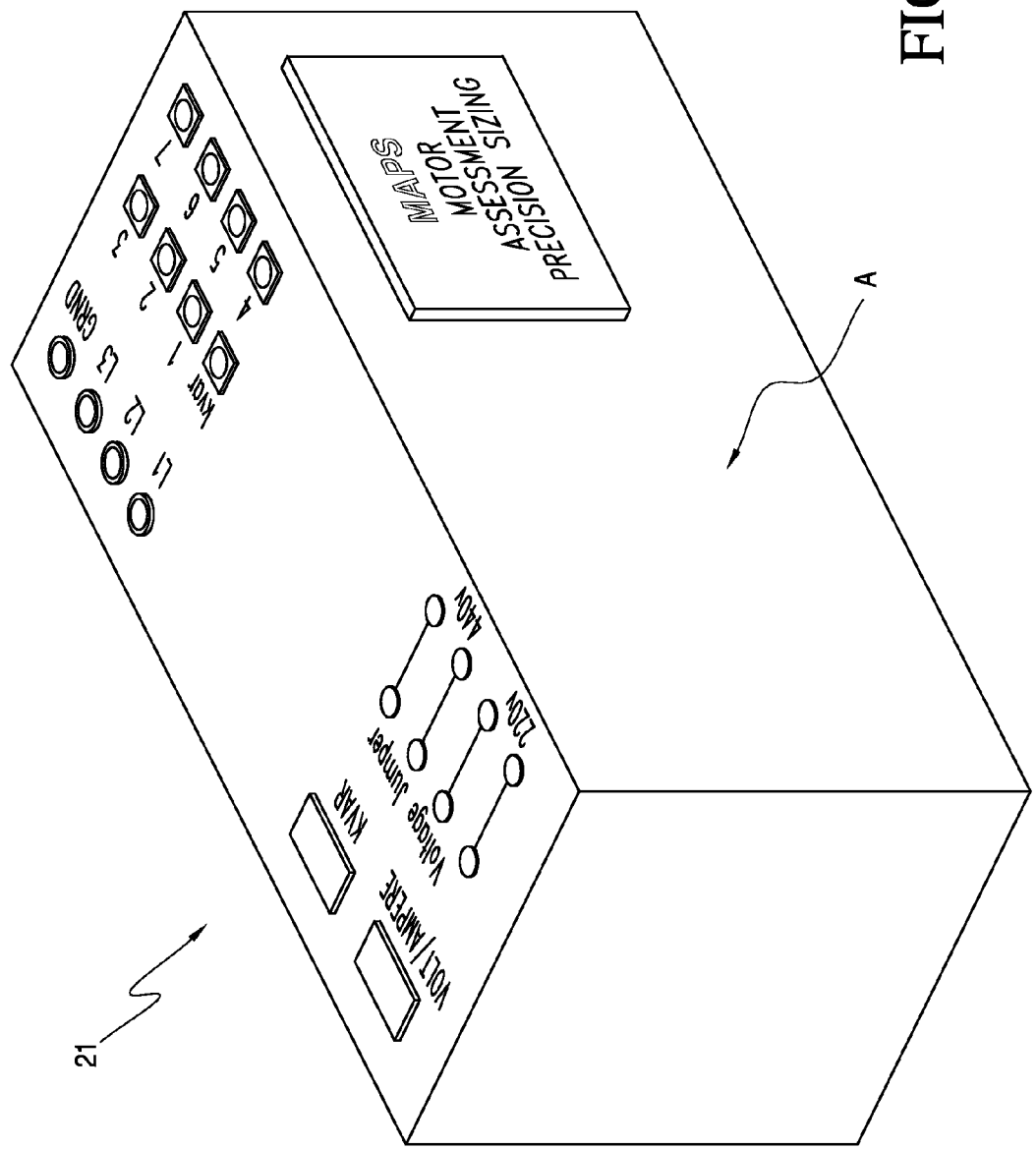

ALL-IN-ONE MOTOR ASSESSMENT PRECISION SIZING SYSTEM AND CAPACITANCE CALCULATOR UNIT

The invention pertains to an all-in-one Motor Assessment Precision Sizing ("MAPS") system that utilizes a precision diagnostics-solution finder unit called a Capacitance Calculator Unit ("CAPCU"). The MAPS-CAPCU (the "System") provides a simple, accurate, complete, and mathematically precise way of individually measuring, in real-time, the actual operating conditions of an alternating current induction motor (the "Electric Motor"). The System measures the power quality of individual inductive loads in order to determine, at virtually zero percent (0%) error, the exact capacitance required to optimally correct the power factor ("PF") of Electric Motors; thereby, improving power consumption, reducing energy wastage, and improving the power output of the motor. The System is capable of mapping all SINGLE PHASE Electric Motors with power rating of up to 75 Horsepower ("HP"); and THREE PHASE motors with power rating between 5 HP and 600 HP.

Electric motors are used in many aspects of everyday life. They are found in elevators, refrigerators, escalators, air exchange handlers, etc. Ideally, the efficiency ratio (or the PF) of the "work output" over the "energy consumed" by the Electric Motors should be 100%. In mathematical terms, 100% PF is expressed as:

$$\frac{1 \text{ Kilowatt of Energy Produced by the Work Output of the Electric motor}}{1 \text{ Kilowatt of Energy Consumed by the Electric Motor}} = 100\%$$

However, despite its prevalence and the developments in its manufacture, Electric Motors have always been inherently inefficient. In reality, Electric Motors have efficiency ratios or PF ranging from 40% to 70% for the very old class (legacy type), from 71% to 82% for the four to ten year-old class, and from 83% to 89% for the so-called "already efficient" class manufactured today.

The low PF is attributable to the time-delay between the running cycles of the electricity coming into the Electric Motors and the "inductive loads" connected to the Electric Motors. An Electric Motor operates by converting electricity into a magnetic field to produce work (e.g. compressing gas, pumping fluid, rotating a pulley, etc.). The amount of electricity or current required to produce the magnetic field is constant. However, when a load is connected to the Electric Motors, more current is needed to produce work to drive the load introduced. In other words, Electric Motors must keep up with the power demand of the load by consuming more electricity. In mathematical terms, it may be viewed as: amount of energy consumed>amount of energy produced. This additional consumption of electricity to produce the same amount of energy accounts for the low PF in Electric Motors.

Although low PF is inherent in all Electric Motors, the rate of efficiency is determinable, predictable, measurable, and controllable. Hence, such rate is capable of being optimized to near 100% PF. Near 100% PF can be achieved by simply installing customized "compensator capacitor/s" that can store and deliver the deficient current to the Electric Motors. Installation of this compensator capacitor is a relatively simple task. The difficulty lies in the determination of the capacitance value (the amount of energy that a capacitor stores) of the compensator capacitor.

At present, the determination of the capacitance value is made by monitoring, and collecting data from, the Electric Motors using at least three (3) multi-meter testers, while such runs for an extended period of time. The information derived is utilized in manually computing for and determining the required capacitance value. This method is prone to error because of the inaccuracies of the monitoring devices and the intrinsic deviations involved in deriving the values. Furthermore, the task is laborious and complicated, as it requires multiple devices (therefore, multiple operators) just for the task of monitoring. These difficulties are those that which the System addresses; through the following:

First, the System achieves 100% or near 100% accuracy in measuring or "mapping" the values relative to the performance of Electric Motors, by using combinations of several capacitors of different capacitance values connected in groups. The actual method of measuring the values needed to determine the exact capacitance value to optimize the PF is achieved by pushing one or a combination of any of the seven push-button switches of the System. Thereafter, when the desired PF is achieved, the values required to calculate the required capacitance value are shown in the digital display of the System.

Second, the System is complete and compact. Compared to the present system of measurement, the System only requires one person for operation. Furthermore, measurement is done instantaneously without need for prolonged monitoring; thereby, an on-the-spot, real-time map of the Electric Motors's performance is provided without need for prolonged data gathering and manual computation.

The summary above only gives a general background of the invention. The detailed description of the invention and the claims should be read together with the attached drawings in order for there to be full understanding of the invention. Hereafter, identical reference numerals refer to identical or similar parts.

Figure 2:
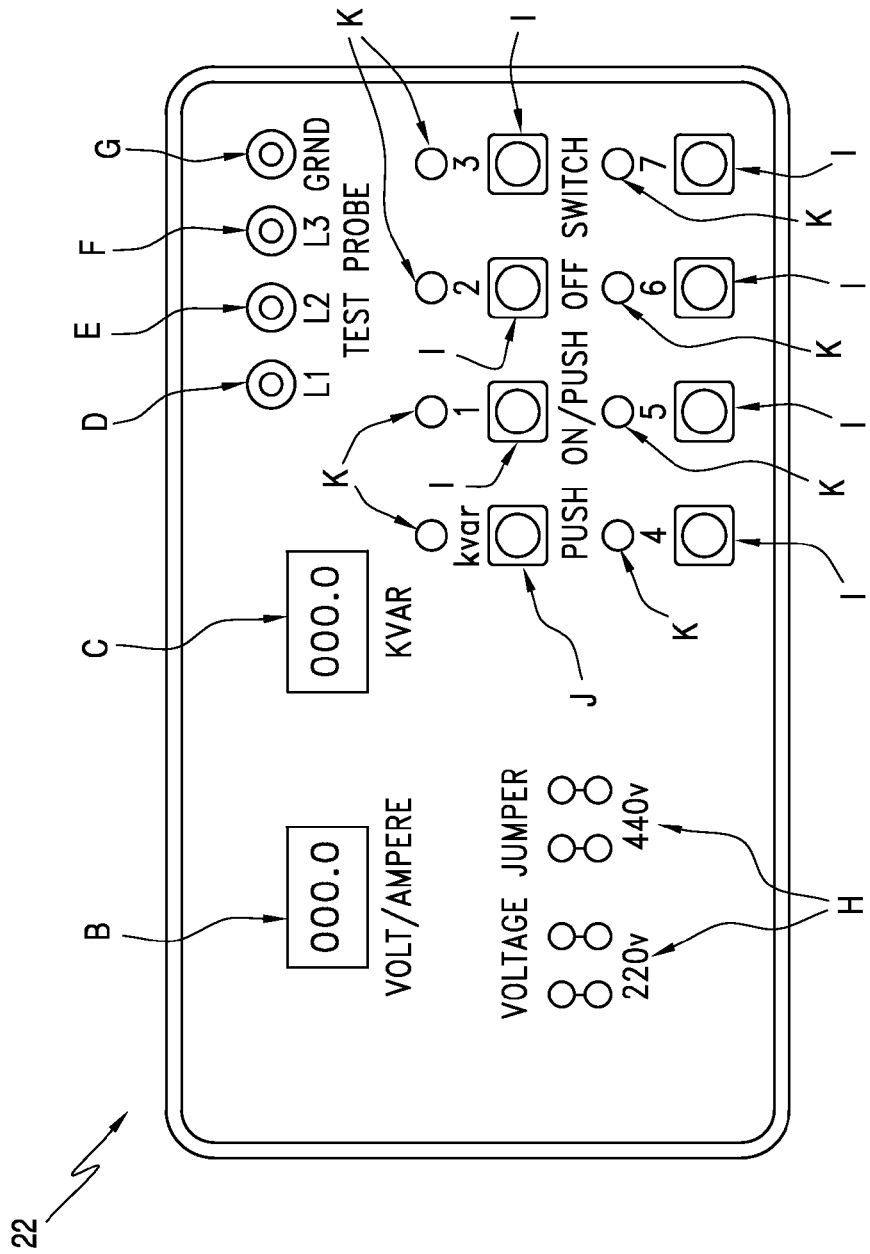
Figure 3:
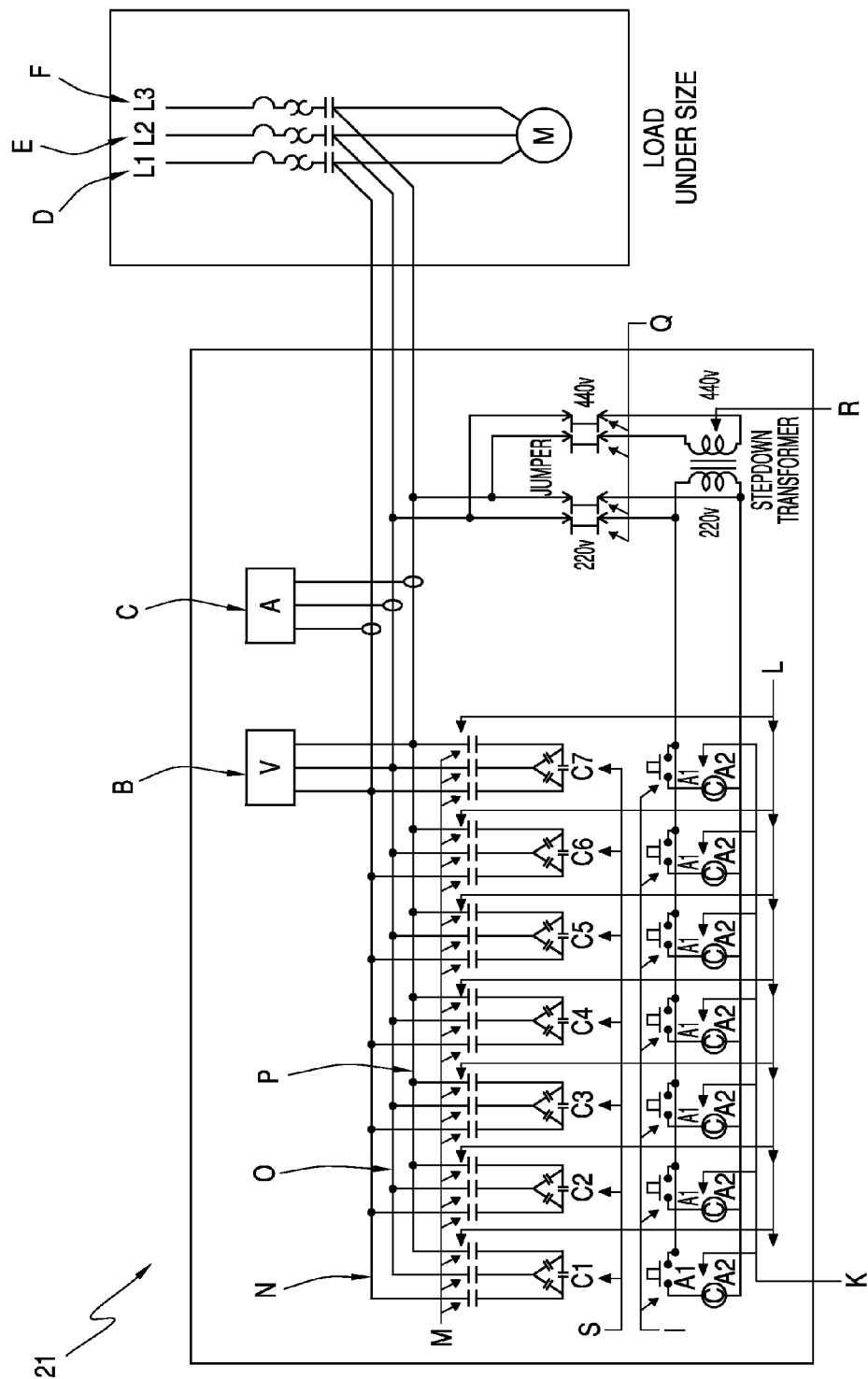

The following drawings are attached to this description:
FIG. 1 is an isometric view of the present invention;
FIG. 2 is the front view of the front panel of the invention; and
FIG. 3 is a schematic diagram of the present invention There is shown in FIG. 1 a MAPS-CAPCU device 21 encased in a rectangular hermetically-sealed NEMA 3R Indoor/Outdoor steel case A. Steel case A is built from bio-safe materials suitable for use in non-hazardous locations with a flash point of +182° C. to 200° C. Steel case A is resistant to ingress of water, rain, sleet, snow, gasoline, and oil. MAPS-CAPCU device 21 is equipped with front panel 22 that houses all of the controls necessary to operate the invention.

In FIG. 2, it is shown that the front panel 22 houses the following: (1) metering device B; (2) power factor correction module C; (3) first three phase lead D; (4) second three phase lead E; (5) third three phase lead F; (6) ground lead G; (7) voltage selector H; (8) push-button switches I; (9) auto-hunting push-button J; and (10) pilot lights K.

Metering device B and power factor correction module C are both four-digit digital output devices that display power factor, voltage, current, frequency, active and reactive energy, active and reactive power, apparent power, and maximum demand.

Push-button switches I and auto-hunting push-button J are electrically connected to pilot lights K as indicators if the corresponding push-button is closed or open. Push-button switches I may be pushed to any of the 128 possible combinations in order to accurately calculate the required capacitance to optimize the PF in the 99% to 100% range. Auto-hunting push-button J may be pushed to by-pass the all push-button switches I and automatically calculate the required capacitance to optimize the PF in the 99% to 100% range.

First three phase lead D, second three phase lead E, and third three, phase lead F electrically connect to lead wires that are in turn attached to the Electric Motors being mapped. For single phase Electric Motors, only first three phase lead D, second three phase lead E, and ground lead G are used to connect to the motor. For three phase Electric Motors, first three phase lead D, second three phase lead E, third three phase lead F, and ground lead are used to connect to the Electric Motor.

FIG. 3 is a schematic diagram of the sizing unit of MAPS-CAPCU device 21 being used with metering device B and power factor correction module C to determine the values needed to optimize the PF. The sizing unit of MAPS-CAPCU device 21 is composed of a plurality of capacitor circuits L electronically connected to first phase bus N, second phase bus O, and third phase bus P. In turn, first phase bus N, second phase bus O, and third phase bus P, are electrically connected to first three phase lead D, second three phase lead E, and third three phase lead F, respectively.

Each capacitor circuit L is mainly composed of a push-button switch I and 3 electronically-connected delta-configured capacitors S. Each delta-connected capacitors S may be activated by pushing the corresponding push-button switch I in order to accurately measure the correct amount of capacitance needed to optimize the PF in the 99% to 100% range. When any or a number of gush-button switch(es) I is (are) closed or opened, the corresponding pilot light(s) K shall turn on or off. Each connection of every delta-connected capacitors S to its corresponding capacitor circuit L is interrupted by a circuit breaker M, which is, in turn, electronically connected to the corresponding push-button switch F. Circuit breaker M provides a certain degree of short circuit and thermal overload protection of the capacitor components.

Each of the two poles of push-buttons I is electrically connected to one of the two 220-Volt poles of transformer R and also electrically connected to one pole of jumper terminal Q. Each on of the two 440-Volt poles of transformer R is likewise electrically connected to one pole of jumper terminal Q. The other pole of jumper terminal Q on the 220-Volt and 440-Volt side of transformer R is electrically connected to second phase bus O, while the other pole of jumper terminal Q on the 220-Volt and 440-Volt side of transformer R is electrically connected to third phase bus P.

The invention claimed is:

1. A MAPS-CAPCU Device comprising:
 a rectangular hermetically-sealed NEMA 3R Indoor/Outdoor steel case with front panel 22;
 said font panel 22 consisting of: metering device B, power factor correction module C, first three phase lead D, second three phase lead E, third three phase lead F, ground lead G, voltage selector H, push-button switches I, auto hunting push-button J, and pilot lights K;
 said metering device B, power factor correction module C, first three phase lead D, second three phase lead E, third three phase lead F, ground lead G, voltage selector H, push button switches I, auto-hunting push button J, and pilot lights K being electrically connected to the sizer circuit of MAPS-CAPCU Device 21;
 said sizer circuit of MAPS-CAPCU Device 21 consisting of metering device B, power factor correction module C, first phase bus N, second phase bus O, third phase bus P, 7 capacitor circuits L, jumper terminal Q, and transformer R;
 said metering device B being electrically connected to first phase bus N, second phase bus O, and third phase bus P;
 said power factor correction module C being electrically connected to first phase bus N, second phase bus O, and third phase bus P;
 said first phase bus N being electrically connected to first three phase lead D;
 said second phase bus O being electrically connected to second three phase lead E;
 said third phase bus P being electrically connected to third three phase lead F;
 said 7 capacitor circuits L consisting of electronically-connected delta-configured capacitors S with the following capacitance values: C1=6 µF, C2=15 µF, C3=30 µF, C4=60 µF, C5=60 µF, C6=60µF, and C7=70 µF;
 said capacitor circuit L consisting of push-button switch I, pilot light K, circuit breaker M, and 3 electronically-connected delta-configured capacitors S;
 said push-button switch I being electrically connected to pilot light K;
 said push-button switch I and pilot light K being electrically connected to transformer R and jumper terminal Q;
 said transformer R being electrically connected to jumper terminal Q;
 said jumper terminal Q being electrically connected to second phase bus O and third phase bus P;
 said delta-configured capacitors S consisting of three capacitors of different capacitance values being electronically connected to circuit breaker M;
 said circuit breaker M being electronically connected to first phase bus N, second phase bus O, and third phase bus P.

* * * * *